United States Patent [19]

Shimomura et al.

[11] Patent Number: 5,132,240

[45] Date of Patent: Jul. 21, 1992

[54] METHOD FOR MANUFACTURING A SEMICONDUCTOR DEVICE

[75] Inventors: Narakazu Shimomura, Gojyo; Masahiro Hasegawa, Tenri, both of Japan

[73] Assignee: Sharp Kabushiki Kaisha, Japan

[21] Appl. No.: 734,470

[22] Filed: Jul. 23, 1991

[30] Foreign Application Priority Data

Aug. 3, 1990 [JP] Japan .................. 2-207060

[51] Int. Cl.$^5$ ............................. H01L 21/70
[52] U.S. Cl. .................. 437/52; 437/47; 437/48; 437/60; 437/228; 437/919
[58] Field of Search .......... 437/47, 48, 52, 60, 437/228, 233, 235, 919; 357/23.6, 51

[56] References Cited

U.S. PATENT DOCUMENTS 4,355,374 10/1982 Sakai et al. ................ 357/51
4,742,018  5/1988 Kimura et al. ............... 437/48

FOREIGN PATENT DOCUMENTS

0295709 12/1988 European Pat. Off. .
0072261  4/1985 Japan .
0270343 10/1989 Japan .

Primary Examiner—Tom Thomas
Attorney, Agent, or Firm—Nixon & Vanderhye P.C.

[57] ABSTRACT

A method for manufacturing a semiconductor device including steps of (i) laminating a first insulating film over a semiconductor substrate having a plurality of gate electrodes, on which side walls are at least formed, through capacitor formation regions, removing the first insulating film in the capacitor formation region so as to form a direct contact, and laminating a first conductive film over the semiconductor substrate including the residual first insulating film, (ii) removing the first conductive film with remaining at least in the capacitor formation region, (iii) sequentially laminating over the semiconductor substrate including the residual first conductive film (a) a second insulating film, a second conductive film and a third insulating film, or (b) a second insulating film and a second conductive film, and then laminating a resist layer over the whole surface, and (iv) patterning the resist layer and removing with the use of a resist pattern (a) the third insulating film, second conductive film, second insulating film and first conductive film, or (b) the second conductive film, second insulating film and first conductive film, so that the capacitor electrodes of a FEC type DRAM cell including a capacitor upper electrode, a capacitor insulating film and a capacitor lower electrode can be formed in the capacitor formation region.

3 Claims, 7 Drawing Sheets

METHOD FOR MANUFACTURING A SEMICONDUCTOR DEVICE

BACKGROUND OF THE INVENTION

1. Field of the Invention

The present invention relates to a method for manufacturing a semiconductor device, and more particularly to a method for dividing capacitor electrodes of a FEC (Floating Electrode Capacitor) type memory cell which is useful as a DRAM (Dynamic Random Access Memory) cell having a wiring width of 0.8μm or less such as a 16 MDRAM.

2. Description of the Prior Art

Figure 6:
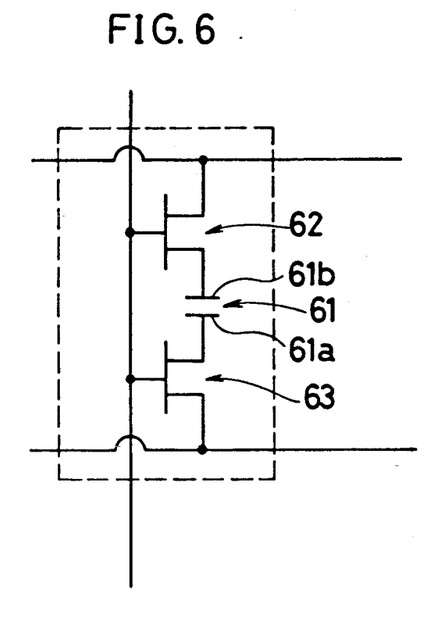
FIGS. 6 is an electric equivalent circuit diagram of a general FEC type DRAM cell.
Figure 7:
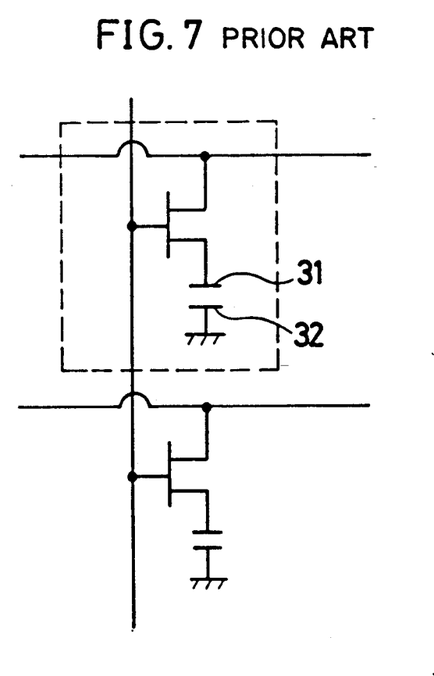
FIG. 7 is an electric equivalent circuit diagram of a conventional DRAM cell.

FIGS. 6 and 7 show electric equivalent circuits of a FEC type DRAM cell and a conventional DRAM cell, respectively.

Referring to the FEC type DRAM cell, a capacitor 61 is connected to transistors 62 and 63. If four kinds of potentials are applied to lower and upper electrodes 61a and 61b of the capacitor 61 as shown in Table 1, the information for 2 bits can be stored by the capacitor 61 and transistors 62 and 63 shown in FIG. 6.

TABLE 1

| State | Applied potential of a FEC type DRAM cell | |
|---|---|---|
| | Upper electrode | Lower electrode |
| "0" | Vcc | 0 |
| "1" | (½) Vcc | (½) Vcc |
| "2" | (½) Vcc | (½) Vcc |
| "3" | 0 | Vcc |

Referring to the conventional memory cell shown in FIG. 7, capacitor electrodes comprises storage electrodes 31 and plate electrodes 32. The storage electrodes 31 are electrically insulated from each other per memory cell. The plate electrodes 32 are not electrically connected to each other and serve as fixed potentials of (½) Vcc. The storage electrodes 31 are formed by etching an electrode material such as polysilicon and dividing the same per memory cell. The plate electrodes 32 are common electrodes. Consequently, it is not necessary to divide the plate electrodes 32 per memory cell. In the FEC type memory cell, it is necessary to electrically divide both electrodes of the capacitor in similar to the storage electrodes 31 of the conventional memory cell. The requirements of capacitor formation are different. Accordingly, a method for forming the capacitor of the conventional DRAM cell is not suitable for forming the capacitor of the FEC type DRAM cell for the following reasons.

Figure 8:
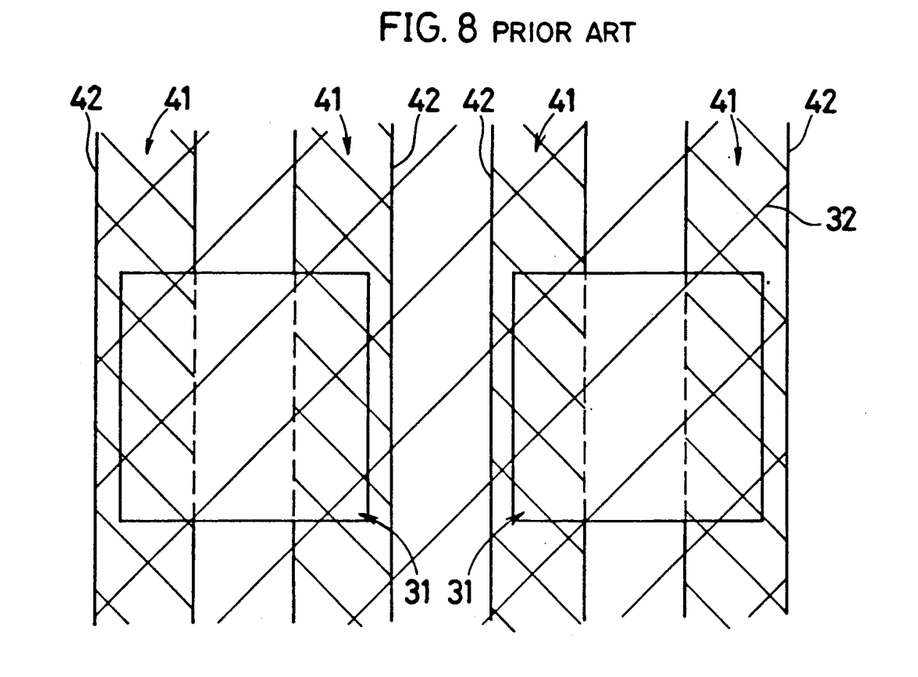
FIG. 8 is a view showing a main portion of a capacitor formed in a step of forming the capacitor of the conventional DRAM cell.
Figure 9:
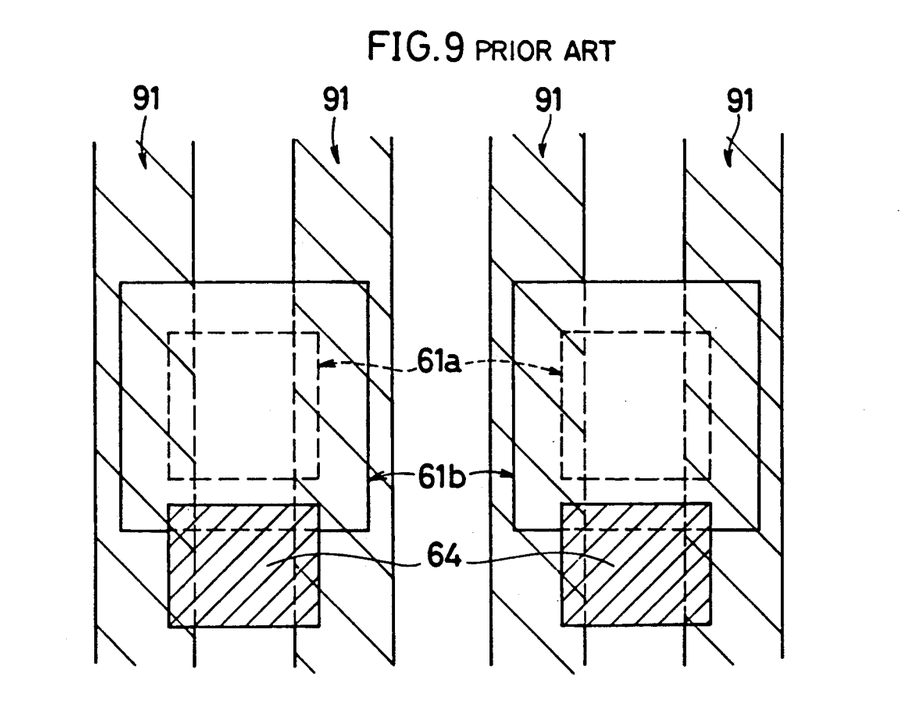
FIG. 9 is a view showing the general FEC type DRAM cell correspondingly to FIG. 8.

FIGS. 8 and 9 are plan views of the electrodes of a memory capacitor which is formed in a capacitor formation step of the conventional method. FIG. 8 shows the capacitor of the conventional DRAM cell. FIG. 9 shows the capacitor of the FEC type DRAM cell.

Referring to the conventional memory cell, the plate electrodes 32 (shown in oblique lines in FIG. 8) are not divided between adjacent cells 41 and 41. Consequently, even if the plate electrodes 32 are shifted from the storage electrodes 31, an overlapping amount of the electrodes 31 and 32 of the capacitor is not greatly changed. Thus, the capacity of the capacitor is seldom increased or decreased. A work line is indicated at 42.

Referring to the FEC type DRAM cell shown in FIG. 9, when the capacitor electrode comprising the lower and upper electrodes 61a and 61b are shifted, the overlapping amount of electrodes 61a and 61b is reduced so that the capacity is decreased. Consequently, it is necessary to ensure the excessive storage capacity of the memory cell correspondingly to the decrease in capacity caused by shift. Accordingly, there is reduced by half the advantage that the same amount of information can be stored by means of half of the capacitors. A word line is indicated at 91. A local wiring is indicated at 64.

To make the most of the advantage of the FEC type DRAM cell, it is necessary to employ a method for forming a capacitor wherein the capacity is not decreased even if the electrodes are shifted at the time of processing.

It is an object of the present invention to provide a method for forming a capacitor suitable for the FEC type DRAM cell.

SUMMARY OF THE INVENTION

The present invention provides a method for manufacturing a semiconductor device comprising steps of (i) laminating a first insulating film over a semiconductor substrate having a plurality of gate electrodes, on which side walls are at least formed, through capacitor formation regions, removing the first insulating film in the capacitor formation region so as to form a direct contact, and laminating a first conductive film over the semiconductor substrate including the residual first insulating film, (ii) removing the first conductive film with remaining at least in capacitor formation region, (iii) sequentially laminating over the semiconductor substrate including the residual first conductive film (a) a second insulating film, a second conductive film and a third insulating film, or (b) a second insulating film and a second conductive film, and then laminating a resist layer over the whole surface, and (iv) patterning the resist layer and removing with the use of a resist pattern (a) the third insulating film, second conductive film, second insulating film and first conductive film, or (b) the second conductive film, second insulating film and first conductive film, so that the capacitor electrodes of a FEC type DRAM cell comprising a capacitor upper electrode, a capacitor insulating film and a capacitor lower electrode can be formed in the capacitor formation region.

DETAILED DESCRIPTION OF PREFERRED EMBODIMENTS

In a step of forming a capacitor of a FEC type DRAM cell, the same photoresist pattern or $SiO_2$ pattern is used as an etching mask in order to successively process a three-layer film comprised of a capacitor upper electrode, a capacitor insulating film and a capacitor lower electrode by an anisotropic etching method such as reactive ion etching (RIE). Consequently, a memory capacitor can be formed.

According to a conventional method, the memory capacitor is formed by using a mask for forming the capacitor lower electrode and a mask for forming the capacitor insulating film and capacitor upper electrode. According to the present invention, the capacitor upper and lower electrodes are simultaneously processed by a single mask. Consequently, it is possible to control the variation of the capacity which is caused by the change of the overlapping amount of the capacitor upper and lower electrodes owing to alignment shift or the like.

The present invention provides a method for manufacturing a semiconductor device wherein a first conductive film portion is formed by etching a first conductive film by the anisotropic etching method such as RIE with the use of a photoresist pattern formed by a projection and exposure method so as to expose the same in regions other than a contact hole formation region.

Furthermore, the present invention provides a method for manufacturing a semiconductor device wherein a local wiring is patterned in order to electrically connect the capacitor upper electrode to a memory cell transistor in the contact hole formation region including a contact hole.

Preferred embodiments of the present invention will be described in more detail with reference to the drawings. The present invention is not limited to the following embodiments.

Figure 1:
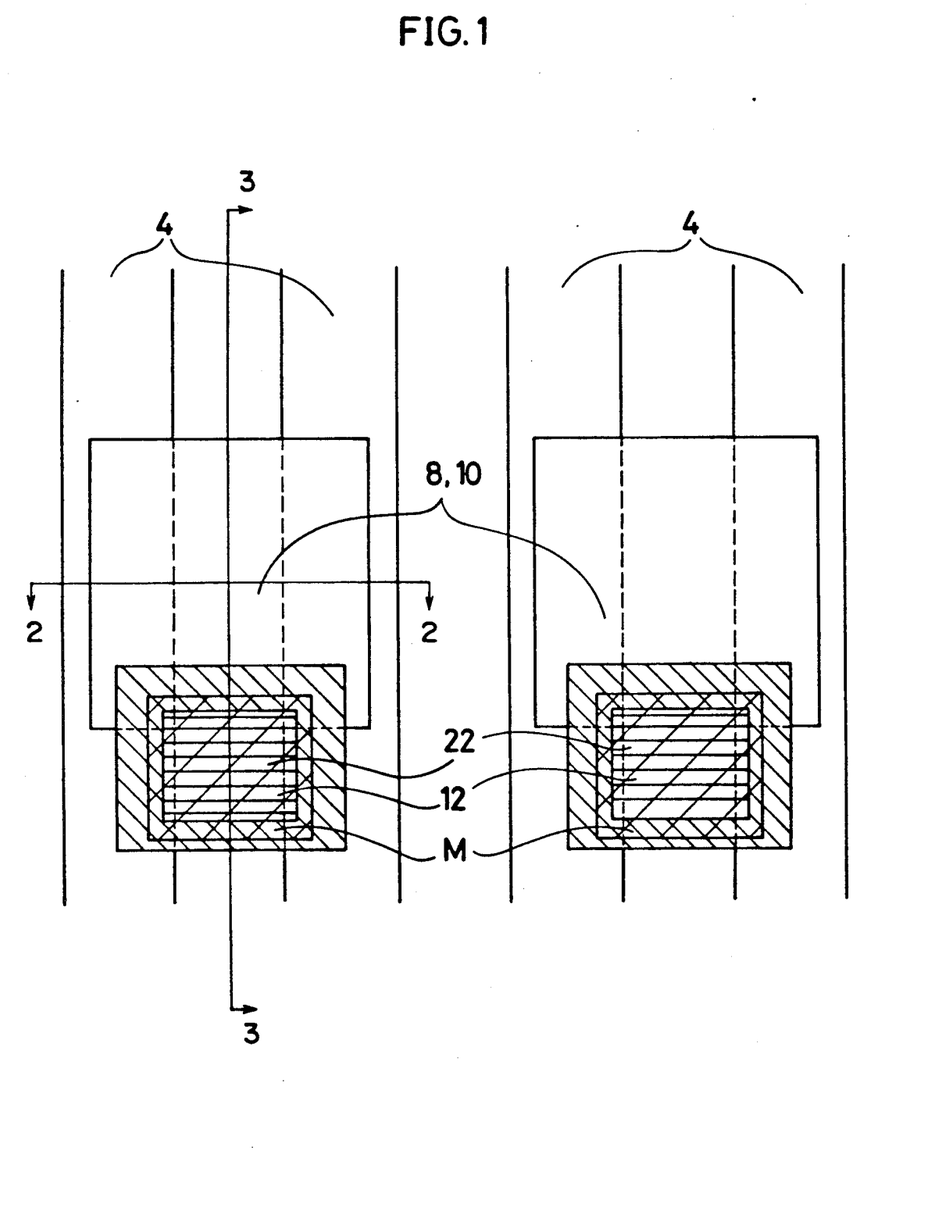
FIG. 1 is a view showing a main portion of a FEC type DRAM cell according to an embodiment of the present invention.
Figure 2A:
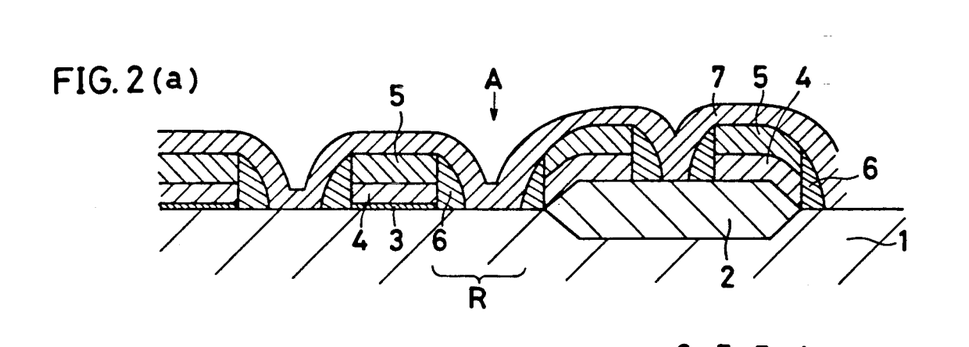
FIGS. 2 and 3 are section views taken along the lines A—A' and B—B' of FIG. 1, respectively.
Figure 2B:
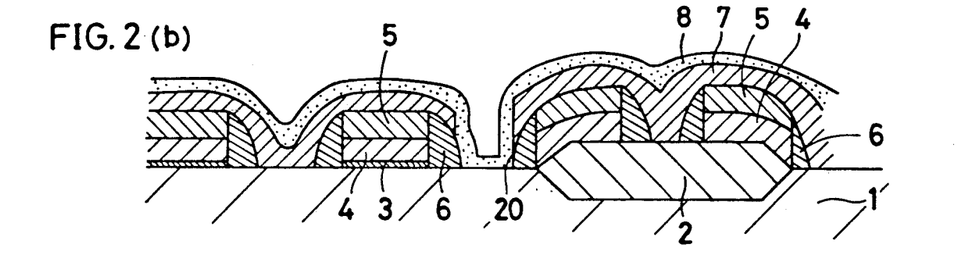
Figure 2C:
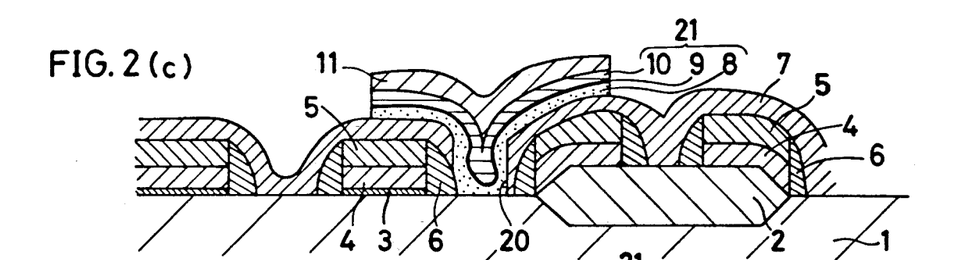
Figure 2D:
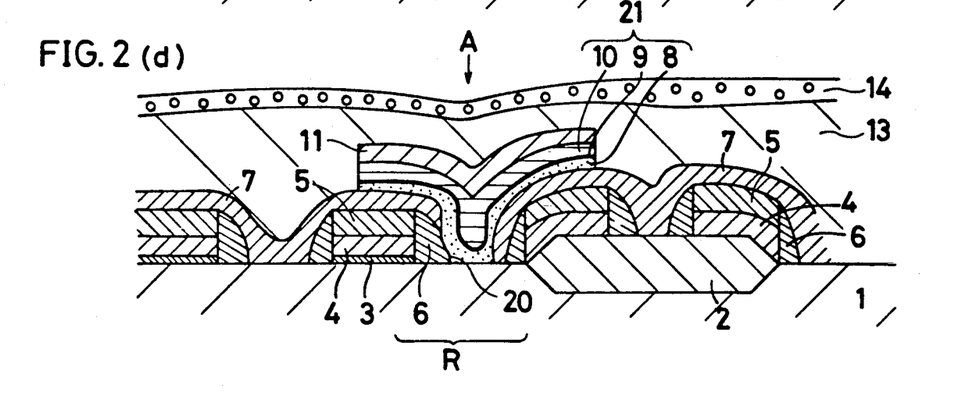
Figure 3A:
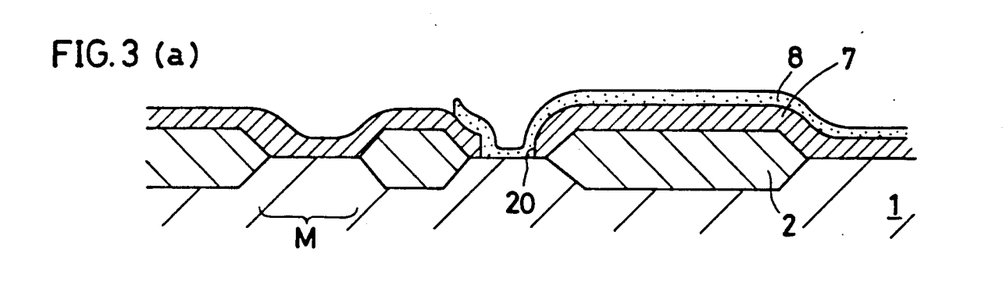
Figure 3B:
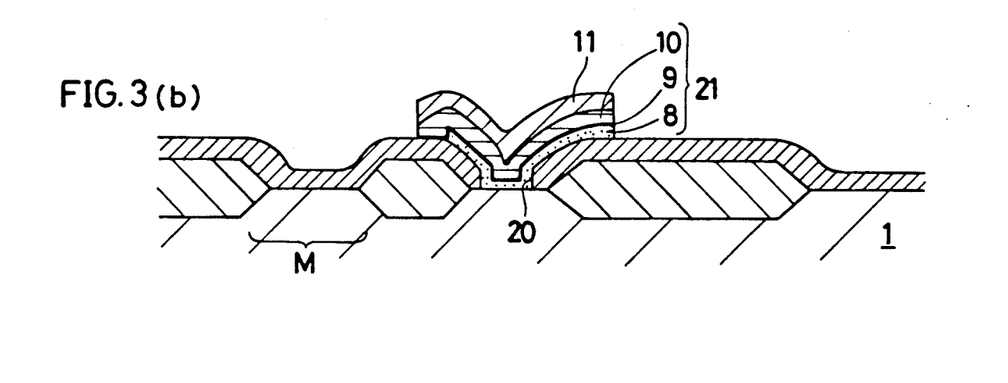
Figure 3C:
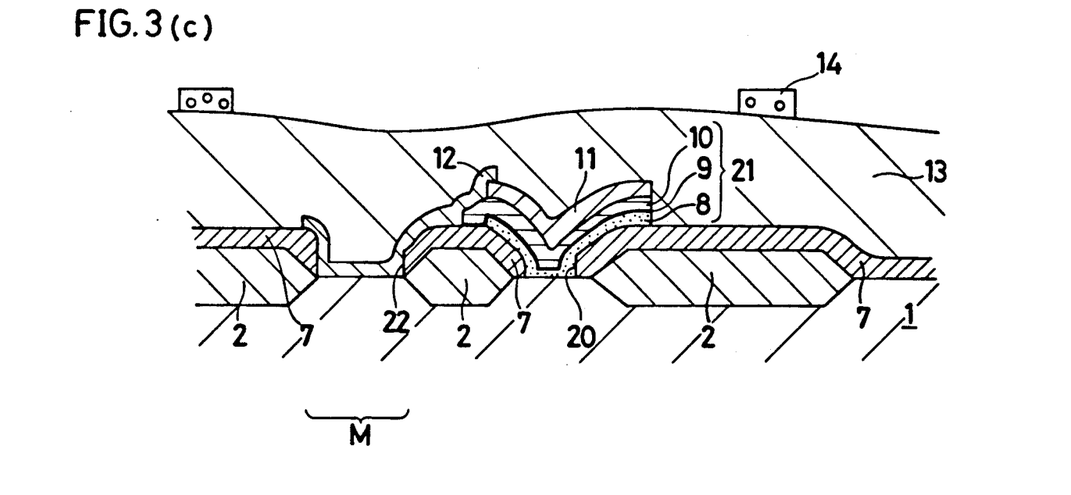

FIG. 1 shows the electrodes of a memory capacitor which is formed in a step of forming a capacitor portion according to an embodiment of the present invention. FIGS. 2 (a) to (d) are section views showing manufacturing steps, taken along the line A—A' of FIG. 1. FIGS. 3 (a) to (c) are section views showing the manufacturing steps, taken along the line B—B' of FIG. 1.

Referring to FIG. 2 (d) and FIG. 3 (c), a FEC type DRAM cell comprises a Si substrate 1 including a $SiO_2$ element isolation film 2, a thermal oxide film 3, polycrystalline Si gate electrodes 4 [see FIG. 2 (d)], a $SiO_2$ film (first insulating film) 7, a direct contact 20, a memory cell capacitor 21, a contact hole 22 [see FIG. 3 (c)], a polycrystalline Si local wiring 12 [see FIG. 3 (c)], a $SiO_2$ film (third insulating film) 11, a $SiO_2$ film (fourth insulating film) 13 and a bit line 14. The polycrystalline Si gate electrodes 4 are provided on the element isolation film 2 and the Si substrate 1 through a capacitor formation region (R) shown by an arrow A, and have $SiO_2$ spacers 5 on their top surfaces and $SiO_2$ spacers 5 on their top surfaces and $SiO_2$ side walls 6 on their side surfaces. The $SiO_2$ film 7 is provided over the Si substrate 1 including the gate electrodes 4. The direct contact 20 is formed in the capacitor formation region (R) of the $SiO_2$ film 7. The memory cell capacitor 21 is provided such that the direct contact 20 is embedded therein. The contact hole 22 electrically connects the Si substrate 1 to a capacitor upper electrode 10 to be described below. The polycrystalline Si local wiring 12 directly comes into contact with and is embedded in the contact hole 22 so as to electrically connect the Si substrate 1 to the upper electrode 10. The $SiO_2$ film 11 is provided on the capacitor 21. The $SiO_2$ film 13 is provided over the substrate including the capacitor 21.

The capacitor 21 has a polycrystalline Si capacitor lower electrode (first conductive film) 8, a $SiO_2$ capacitor insulating film (second insulating film) 9 and a polycrystalline Si capacitor upper electrode (second conductive film) 10.

A manufacturing method will be described below.

In FIG. 2 (a), a gate wiring of a MOS transistor is formed by the thermal oxide film 3 having a thickness of about 100 Å and a polycrystalline Si film 4 having a thickness of about 3000 Å on the Si substrate 1 which is isolated by the element isolation film 2 having a thickness of 0.4 μm. The polycrystallin Si film 4 has phosphorus dispersed at a high density. The, the $SiO_2$ film is deposited on the top and side surfaces of the gate wiring by a CVD method. Thereafter, the $SiO_2$ spacers 5 and $SiO_2$ side walls 6 are formed by a known anisotropic etching such as RIE. Subsequently, the $SiO_2$ film (first insulating film) 7 having a thickness of about 0.2 μm is deposited over the Si substrate 1 including the gate wiring by the CVD method. A photoresist pattern formed by a projection and exposure method is used as a mask so as to remove the $SiO_2$ film 7 in the portion A (region R) shown in FIG. 2 (a) by the anisotropic etching method such as RIE. Consequently, the direct contact 20 is formed [see FIG. 2 (b) and FIG. 3 (a)].

Then, the polycrystalline Si film (first conductive film) 8 having a thickness of about 0.05 μm, on which the phosphorus is doped at the high density, is deposited over the Si substrate 1 including the direct contact 20. The polycrystalline Si film 8 is etched by the anisotropic etching method such as RIE with the use of the photoresist pattern formed by the projection and exposure method [see FIG. 2 (b) and FIG. 3 (a)]. The etching region of the polycrystalline Si film 8 does not include a region shown in FIG. 2 (b), so that the etching state does not appear. In this case, there is simultaneously formed a region M in which the contact hole 22 is to be formed [see FIG. 3 (a)]. In FIG. 1, the region M indicates the periphery of the contact hole 22 (a region in which the polycrystalline Si film 8 is removed).

Thereafter, a $SiO_2$ film (second insulating film) for forming a capacitor insultating film (not shown), a polycrystalline Si film (second conductive film) (not shown) and a $SiO_2$ film (third insulating film) (not shown) are sequentially deposited over the Si substrate 1 including the residual polycrystalline Si film 8. The $SiO_2$ film (second insulating film) is formed by a pressure reducing CVD method. The polycrystalline Si film (second conductive film) has a thickness of about 0.05 μm and has the phosphorus doped at the high density. The $SiO_2$ film (third insulating film) has a thickness of about 0.1 μm. Thereafter, the photoresist pattern if formed by the projection and exposure method so as to define the shape of capacitor electrodes. The $SiO_2$ film, polycrystalline Si film, capacitor insulating film and the polycrystalline Si film are simultaneously etched by the anisotropic etching method such as RIE with the use of the photoresist pattern as the mask, so that the $SiO_2$ film 11, the capacitor upper electrode 10 of the polycrystalline Si film, the capacitor insulating film 9 and the capacitor lower electrode 8 of the polycrystalline Si film are formed. Consequently, the capacitor electrode 21 is formed on the direct contact 20 [see FIG. 2 (c) and FIG. 3 (b)].

Subsequently, the SiO$_2$ film 7 in the region M is removed to form the contact hole 22. The local wiring 12 is formed in a region including the region M between the capacitor upper electrode 10 and the memory cell transistor [see FIG. 3 (c)]. The local wiring 12 is comprised of the polycrystalline Si film on which phosphorus is doped at the high density. The SiO$_2$ film 13 is deposited over the Si substrate 1 including the local wiring 12 and the capacitor electrode 21. The, the SiO$_2$ film 13 is flattened. Thereafter, the bit line 14 is provided on the SiO$_2$ film 13 [see FIG. 2 (d) and FIG. 3 (c)]. The bit line 14 is comprised of a multilayer film which is formed by sequentially laminating a high melting point metal layer, a high melting point metal silicide layer and the polycrystalline Si layer on which impurities are doped at the high density.

The FEC type DRAM cell is formed according to the above-mentioned steps.

Figure 4A:
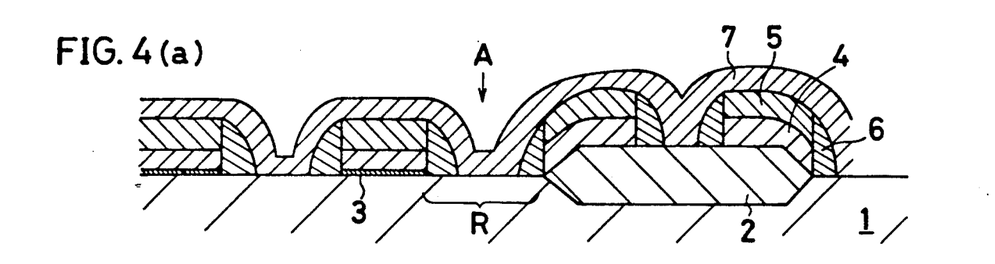
FIGS. 4 and 5 are views showing another embodiment of the present invention correspondingly to FIGS. 2 and 3, respectively.
Figure 4B:
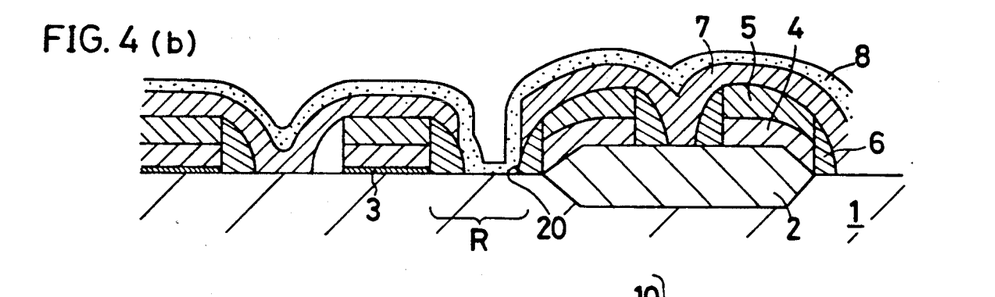
Figure 4C:
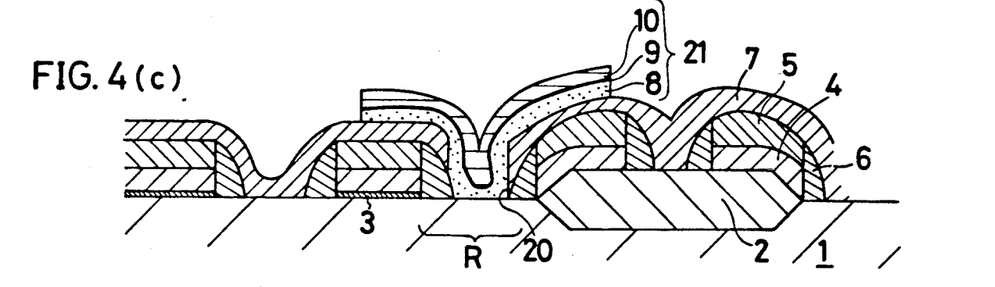
Figure 4D:
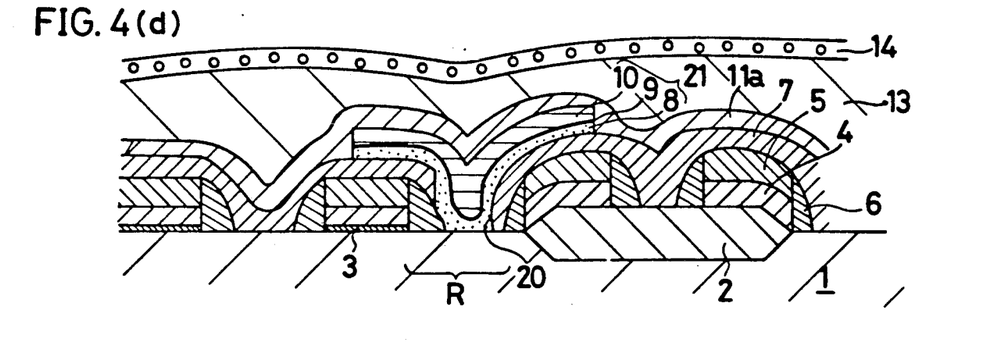
Figure 5A:
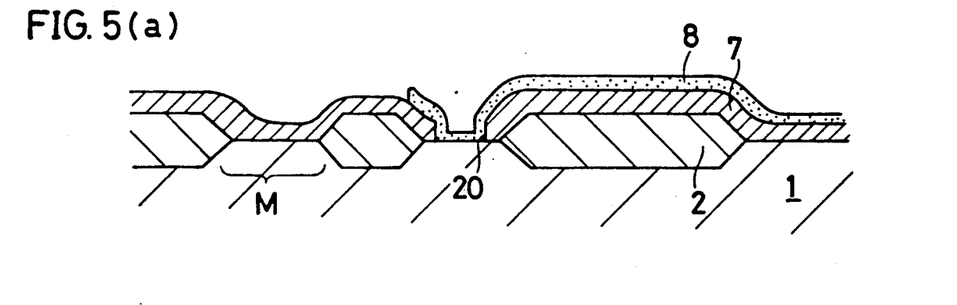
Figure 5B:
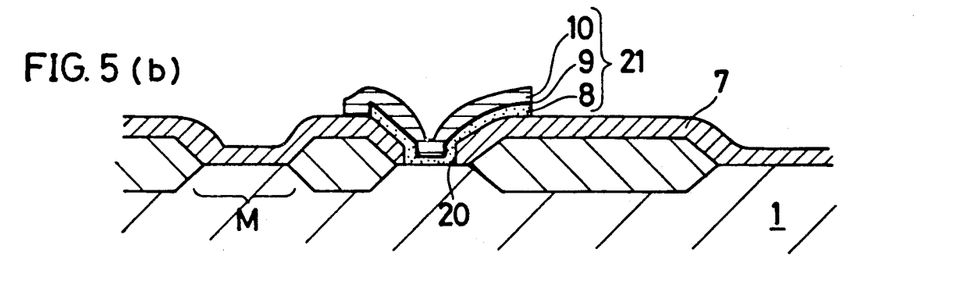
Figure 5C:
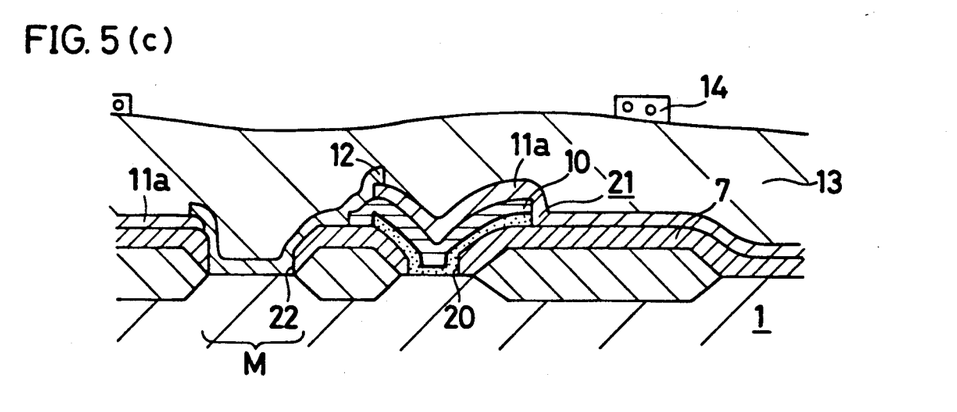

FIGS. 4 and 5 show another embodiment of the present invention. In the case where a capacitor electrode 21 is to be formed, a SiO$_2$ film 11 [see FIG. 3 (b)] and a capacitor 21 are not simultaneously formed. A second conductive layer, a second insulating film and a first conductive layer are sequentially etched in advance so as to form only the capacitor electrode 21 [see FIG. 4 (c) and FIG. 5 (b)]. Then, a SiO$_2$ film (not shown) is provided over a Si substrate 1 including the capacitor electrode 21. Thereafter, a SiO$_2$ film 11a is formed [see FIG. 5 (c)]. The SiO$_2$ film 11a electrically insulates the capacitor electrode 21 from a local wiring 12 to be formed on a contact hole 22.

A manufacturing method will be described below.

In FIG. 4 (a), a gate wiring of a MOS transistor is formed by a thermal oxide film 3 and a polycrystalline Si film 4 on a Si substrate 1. The Si substrate 1 is isolated by an element isolation film 2 having a thickness of about 0.4 $\mu$m. The thermal oxide film 3 has a thickness of about 100 Å. The polycrystalline Si film 4 has a thickness of about 3000 Å and has phosphorus dispersed at a high density. A SiO$_2$ film is deposited on the top and side surfaces of the gate wiring by a CVD method. Then, SiO$_2$ spacers 5 and SiO$_2$ side walls 6 are formed by an anisotropic etching method such as RIE. Thereafter, a SiO$_2$ film 7 having a thickness of about 0.2 $\mu$m is deposited on the gate wiring by the CVD method. Subsequently, a photoresist pattern is formed in a portion A (region R) shown in FIG. 4 (a) by a projection and exposure method. The SiO$_2$ film 7 is removed by the anisotropic etching such as RIE with the use of the photoresist pattern as a mask. FIG. 4 (b) and FIG. 5 (a) show the residual SiO$_2$ film 7. In this case, the SiO$_2$ film 7 in the region R is removed to form a direct contact 20.

Then, deposited is a polycrystalline Si film 8 which has a thickness of about 0.05 $\mu$m and has the phosphorus doped at the high density [see FIG. 4 (b)]. Thereafter, the polycrystalline Si film 8 is etched by the anisotropic etching method such as RIE with the use of the photoresist pattern formed by the projection and exposure method [see FIG. 5 (a)]. In this case, a contact hole is to be formed in a region M shown in FIG. 5 (a).

Subsequently, a capacitor insulating film and a polycrystalline Si film are sequentially deposited over the residual polycrystalline Si film 8. The capacitor insulating film is formed by a pressure reducing CVD method. The polycrystalline Si film has a thickness of about 0.05 $\mu$m and has the phosphorus doped at the high density. Then, a photoresist pattern is formed by the projection and exposure method in order to define the shape of a capacitor electrode. A polycrystalline Si film 10, a capacitor insulating film 9 and the polysilicon Si film 8 are etched by the anisotropic etching method such as RIE with the use of the photoresist pattern as the mask. Consequently, a capacitor electrode 21 is formed [see FIG. 4 (c) and FIG. 5 (b)].

Then, a SiO$_2$ film 11a having a thickness of about 0.1 $\mu$m is deposited [see FIG. 4 (d)]. Thereafter, a photoresist pattern for defining the shape of a contact hole 22 is formed between the capacitor upper electrode 10 and the memory cell transistor (substrate) 1 by the projection and exposure method. The SiO$_2$ film 11a is removed by using the photoresist pattern as the mask. The portion to be removed is shown in FIG. 5 (c). The residual SiO$_2$ film 11a is shown in FIG. 5 (c). Consequently, the contact hole 22 is formed.

Subsequently, a local wiring 12 is formed between the capacitor upper electrode 10 and the memory cell transistor. The local wiring 12 is comprised of a polycrystalline Si film on which the phosphorus is doped at the high density. The Si substrate surface is flattened by a SiO$_2$ film 13. Then, a bit line 14 is provided [see FIG. 4 (d) and FIG. 5 (c)]. The bit line 14 is comprised of a multilayer film formed by sequentially laminating a high melting point metal layer, a high melting point metal silicide layer and a polycrystalline Si layer on which impurities are doped at the high density.

According to the present invention, the capacitor lower electrode can be self-aligned with the capacitor upper electrode. Accordingly, it is possible to prevent the decrease in capacity caused by the shift of the upper and lower electrodes at the time of processing. Consequently, it is not necessary to compensate for the decrease in capacity. The capacity is small so that the area of a memory cell can be reduced. Therefore, there can be obtained a high density DRAM cell. The FEC type DRAM cell is useful for the high density DRAM including a 16 MDRAM. According to the present invention, it is possible to obtain the high density DRAM including the 16 MDRAM.

What is claimed is:

1. A method for manufacturing a semiconductor device comprising steps of;
  (i) laminating a first insulating film over a semiconductor substrate having a plurality of gate electrodes, on which side walls are at least formed, through capacitor formation regions, removing the first insulating film in the capacitor formation region so as to form a direct contact, and laminating a first conductive film over the semiconductor substrate,
  (ii) removing the first conductive film to form a residual first conductive film at least in the capacitor formation region,
  (iii) sequentially laminating over the semiconductor substrate including the residual first conductive film
    (a) a second insulating film, a second conductive film and a third insulating film, or
    (b) a second insulating film and a second conductive film, and then laminating a resist layer over the substrate surface, and
  (iv) patterning the resist layer and removing with the use of a resist pattern
    (a) the third insulating film, second conductive film, second insulating film and residual first conductive film, or (b) the second conductive film, second insulating film and first conductive film, so that the capacitor electrodes of a floating electrode capacitor DRAM cell comprising a capacitor upper electrode, a capacitor insulating film and a capacitor lower electrode can be formed in the capacitor formation region.

2. A method for manufacturing a semiconductor device according to claim 1, wherein a first conductive film portion is formed by etching the first conductive film by an anisotropic etching method with the use of a photoresist pattern formed by a projection and exposure method so as to expose the first conductive film in regions other than a contact hole formation region.

3. A method for manufacturing a semiconductor device according to claim 1, wherein a local wiring is patterned in order to electrically connect the capacitor upper electrode to a memory cell transistor in the contact hole formation region including a contact hole.

* * * * *